United States Patent
Parker et al.

(12) 
(10) Patent No.: US 6,787,440 B2
(45) Date of Patent: Sep. 7, 2004

(54) METHOD FOR MAKING A SEMICONDUCTOR DEVICE HAVING AN ULTRA-THIN HIGH-K GATE DIELECTRIC

(75) Inventors: Christopher G. Parker, Portland, OR (US); Markus Kuhn, Hillsboro, OR (US); Ying Zhou, Tigard, OR (US); Scott A. Hareland, Tigard, OR (US); Suman Datta, Beaverton, OR (US); Nick Lindert, Beaverton, OR (US); Robert S. Chau, Beaverton, OR (US); Timothy E. Glassman, Portland, OR (US); Matthew V. Metz, Hillsboro, OR (US); Sunit Tyagi, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 12 days.

(21) Appl. No.: 10/315,268

(22) Filed: Dec. 10, 2002

(65) Prior Publication Data

US 2004/0110361 A1 Jun. 10, 2004

(51) Int. Cl.[7] .......................................... H01L 21/4763
(52) U.S. Cl. ...................... 438/591; 438/216; 438/287; 438/785
(58) Field of Search ................................ 438/216, 240, 438/261, 287, 591, 770–772, 778, 785

(56) References Cited

U.S. PATENT DOCUMENTS

| | | | |
|---|---|---|---|
| 5,625,217 A | 4/1997 | Chau et al. | 257/412 |
| 5,783,478 A | 7/1998 | Chau et al. | 438/592 |
| 5,891,798 A | 4/1999 | Doyle et al. | 438/624 |
| 6,020,024 A | * 2/2000 | Maiti et al. | 427/248.1 |
| 6,121,094 A | 9/2000 | Gardner et al. | 438/287 |
| 6,184,072 B1 | 2/2001 | Kaushik et al. | |
| 6,306,742 B1 | 10/2001 | Doyle et al. | 438/591 |
| 6,420,279 B1 | 7/2002 | Ono et al. | |
| 6,436,777 B1 | 8/2002 | Ota | 438/305 |
| 6,514,828 B2 | 2/2003 | Ahn et al. | 438/297 |
| 6,544,906 B2 | 4/2003 | Rotondaro et al. | |
| 6,617,209 B1 | 9/2003 | Chau et al. | 438/240 |
| 6,617,210 B1 | 9/2003 | Chau et al. | 438/240 |
| 6,674,138 B1 * | 1/2004 | Halliyal et al. | 257/411 |
| 6,682,973 B1 * | 1/2004 | Paton et al. | 438/240 |
| 6,689,675 B1 | 2/2004 | Parker et al. | 438/585 |
| 6,693,004 B1 * | 2/2004 | Halliyal et al. | 438/240 |
| 6,713,358 B1 | 3/2004 | Chau et al. | 438/287 |
| 2002/0102797 A1 * | 8/2002 | Muller et al. | 438/287 |
| 2002/0197790 A1 | 12/2002 | Kizilyalli et al. | 438/240 |
| 2003/0032303 A1 | 2/2003 | Yu et al. | |
| 2003/0042557 A1 * | 3/2003 | Shimamoto et al. | 257/406 |
| 2003/0045080 A1 | 3/2003 | Visokay et al. | 438/591 |
| 2004/0028952 A1 * | 2/2004 | Cartier et al. | 428/698 |

OTHER PUBLICATIONS

Polishchuk et al., "Dual Workfunction CMOS Gate Technology Based on Metal Interdiffusion," www.eesc.berkeley.edu, 1 page.

Doug Barlage et al., "High–Frequency Repsonse of 100nm Integrated CMOS Transistors with High–K Gate Dielectrics", 2001 IEEE, 4 pages.

Robert Chau et al., A 50nm Depleted–Substrate CMOS Transistor (DST), 2001 IEEE, 4 pages.

* cited by examiner

Primary Examiner—Anh Phung
Assistant Examiner—Beth E. Owens
(74) Attorney, Agent, or Firm—Mark V. Seeley

(57) ABSTRACT

A method for making a semiconductor device is described. That method comprises forming on a substrate a buffer layer and a high-k gate dielectric layer, oxidizing the surface of the high-k gate dielectric layer, and then forming a gate electrode on the oxidized high-k gate dielectric layer.

13 Claims, 2 Drawing Sheets

METHOD FOR MAKING A SEMICONDUCTOR DEVICE HAVING AN ULTRA-THIN HIGH-K GATE DIELECTRIC

FIELD OF THE INVENTION

The present invention relates to methods for making semiconductor devices, in particular, semiconductor devices that include high-k gate dielectric layers.

BACKGROUND OF THE INVENTION

MOS field-effect transistors with very thin silicon dioxide based gate dielectrics may experience unacceptable gate leakage currents. Forming the gate dielectric from certain high-k dielectric materials, instead of silicon dioxide, can reduce gate leakage. Such a dielectric may not, however, be compatible with polysilicon—the preferred material for making the device's gate electrode.

When the gate dielectric includes a high-k film, a thin layer of silicon dioxide or silicon oxynitride may be formed between the channel and the high-k film to maintain acceptable electron mobility on the high-k film. When such a buffer layer is added to a very thin gate dielectric, the high-k film must be extremely thin, e.g., less than about 10 angstroms thick. When such an ultra-thin high-k film comprises an oxide, it may manifest oxygen vacancies and excess impurity levels. Oxygen vacancies may permit undesirable interaction between the high-k film and the gate electrode. When the gate electrode comprises polysilicon, such interaction may alter the electrode's workfunction or cause the device to short through the dielectric.

Accordingly, there is a need for an improved process for making a semiconductor device that includes a high-k gate dielectric. There is a need for such a process for producing a device that is not shorted through the gate dielectric. There is a need for a process for forming a very thin gate dielectric, which includes a buffer layer and a high-k film, that improves the interface between the high-k film and the gate electrode by repairing oxygen vacancies in the high-k film and removing impurities from that film. The method of the present invention provides such a process.

DETAILED DESCRIPTION OF THE PRESENT INVENTION

Figure 1A:
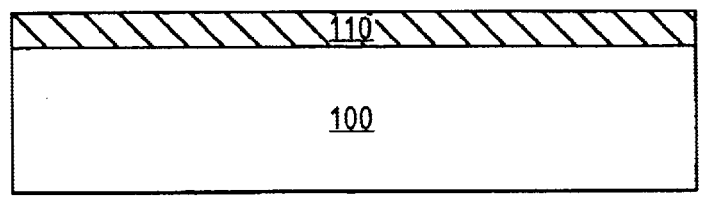
FIGS. 1a–1d represent cross-sections of structures that may be formed when carrying out an embodiment of the method of the present invention.

A method for making a semiconductor device is described. That method comprises forming on a substrate a buffer layer and a high-k gate dielectric layer. After the surface of the high-k gate dielectric layer is oxidized, a gate electrode is formed on that surface. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

In an embodiment of the method of the present invention, a buffer layer and a high-k gate dielectric layer are formed on a substrate. That substrate may comprise a bulk silicon or silicon-on-insulator substructure. Alternatively, it may comprise other materials—which may or may not be combined with silicon—such as: germanium, indium antimonide, lead telluride, indium arsenide, indium phosphide, gallium arsenide, or gallium antimonide. Although several examples of materials from which the substrate may be formed are described here, any material that may serve as a foundation or base upon which a semiconductor device may be built falls within the spirit and scope of the present invention.

When the substrate comprises a silicon wafer, the wafer may be cleaned before forming the buffer layer and the high-k gate dielectric layer on its surface. To clean the wafer, it may initially be exposed to a dilute hydrofluoric acid ("HF") solution, e.g., a 50:1 water to HF solution. The wafer may then be placed in a megasonic tank, and exposed first to a water/$H_2O_2$/$NH_4OH$ solution, then to a water/$H_2O_2$/HCl solution. The water/$H_2O_2$/$NH_4OH$ solution may remove particles and organic contaminants, and the water/$H_2O_2$/HCl solution may remove metallic contaminants.

After that cleaning treatment, the buffer layer and the high-k gate dielectric layer may be formed on the substrate. In one embodiment of the present invention, the buffer layer is formed on the substrate prior to forming the high-k gate dielectric layer on the buffer layer. In another embodiment, the high-k gate dielectric layer is formed directly on the substrate, and the buffer layer is subsequently formed between the substrate and the high-k gate dielectric layer to separate the substrate and the high-k gate dielectric layer.

FIGS. 1a–1d illustrate the embodiment in which the buffer layer is formed on the substrate prior to forming the high-k gate dielectric layer on the buffer layer. In this embodiment, buffer layer 110 is formed on substrate 100 to generate the structure illustrated by FIG. 1a. Buffer layer 110 may be formed from any material that may ensure acceptable electron mobility on the subsequently deposited high-k film. Such materials include, for example, silicon oxides (e.g., silicon dioxide) and silicon oxynitride.

In a preferred embodiment, buffer layer 110 comprises a very thin silicon dioxide or silicon oxynitride layer that is grown using conventional thermal oxidation and/or nitridation steps. Alternatively, buffer layer 110 may be deposited using a conventional chemical vapor deposition process. Buffer layer 110 preferably is less than about 15 angstroms thick, and more preferably between about 5 angstroms and about 15 angstroms thick.

Figure 1B:
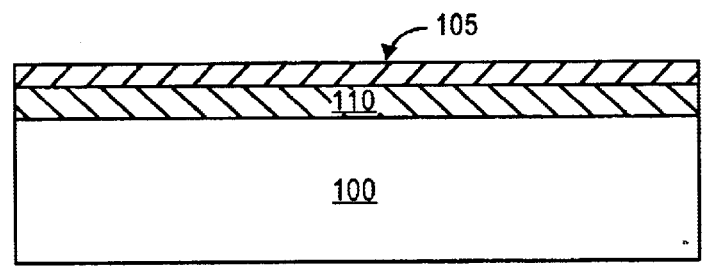
Figure 1C:
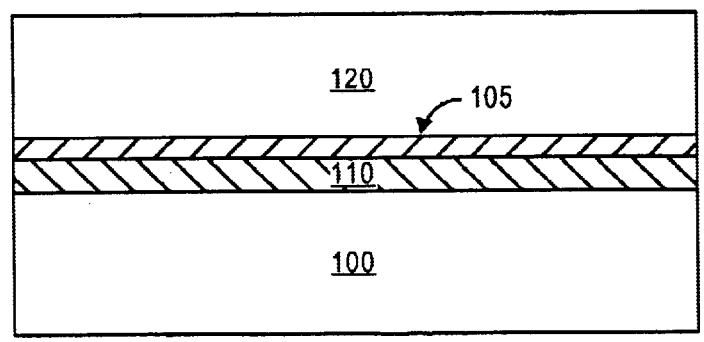
Figure 1D:
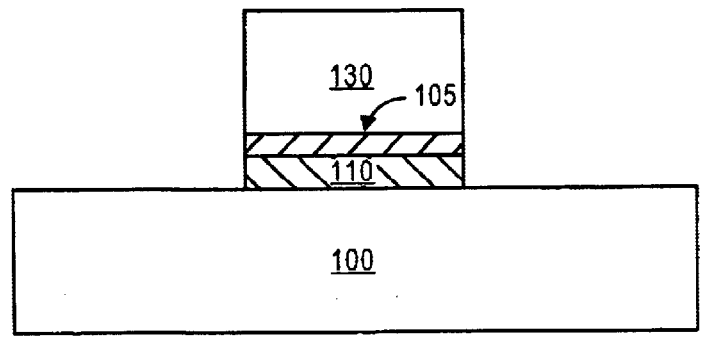

After forming buffer layer 110, high-k gate dielectric layer 105 is deposited on its surface, generating the FIG. 1b structure. High-k gate dielectric layer 105 comprises a material with a dielectric constant that is greater than the dielectric constant of silicon dioxide. Dielectric layer 105 preferably has a dielectric constant that is at least about twice that of silicon dioxide, i.e., a dielectric constant that is greater than about 8. Materials that may be used to make high-k gate dielectrics include: hafnium oxide, lanthanum oxide, zirconium oxide, zirconium silicon oxide, titanium oxide, tantalum oxide, yttrium oxide, and aluminum oxide. Particularly preferred are hafnium oxide, zirconium oxide, titanium oxide, and aluminum oxide. Although a few examples of materials that may be used to form dielectric layer 105 are described here, that layer may be made from other materials that serve to reduce gate leakage.

High-k gate dielectric layer 105 may be formed on buffer layer 110 using a conventional deposition method, e.g., a conventional chemical vapor deposition ("CVD"), low pressure CVD, or physical vapor deposition ("PVD") process.

Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between buffer layer 110 and dielectric layer 105. The CVD reactor should be operated long enough to form a layer with the desired thickness. In a preferred embodiment, dielectric layer 105 is an ultra-thin layer, i.e., a layer that is less than about 20 angstroms thick, and more preferably that is between about 5 angstroms and about 20 angstroms thick.

In the method of the present invention, high-k gate dielectric layer 105 is then reoxidized. In a preferred embodiment, a plasma assisted oxidation process may be used to reoxidize high-k gate dielectric layer 105. In such a process, the surface of high-k gate dielectric layer 105 may be oxidized by exposing that surface to ionized oxygen species generated by a plasma source. Such ionized oxygen species may be generated, for example, by feeding oxygen, nitrous oxide or a mixture of oxygen and nitrous oxide into the reactor, then striking a plasma within the reactor. Alternatively, the plasma may be stricken remotely, and then the resulting ionized oxygen species may be fed into the reactor. Ionized oxygen species may also be created by striking a plasma remotely using a carrier gas, e.g., argon or helium, feeding the resulting ionized components into the reactor, then feeding oxygen, nitrous oxide or a mixture of oxygen and nitrous oxide into the reactor—downstream from the plasma source.

When a plasma assisted oxidation process is used to reoxidize dielectric layer 105, the reactor should be operated under the appropriate conditions (e.g., pressure, radio frequency, and power) for a sufficient time to significantly increase the ratio of oxygen to metal at the surface of the dielectric layer, thereby reducing oxygen vacancies present in that layer. In this embodiment, that reoxidation step preferably takes place at a relatively low temperature, e.g., at a temperature that is less than about 500° C.

As an alternative to using a plasma assisted oxidation process to reoxidize high-k gate dielectric layer 105, a thermal oxidation process (which takes place in an appropriate oxidizing ambient) may be used. For example, a rapid thermal oxidation step, which occurs at less than about 600° C. and lasts for less than about 60 seconds, may be adequate to increase the ratio of oxygen to metal to an acceptable level. A 400° C., 30 second, rapid thermal oxidation treatment appears to give satisfactory results. By reoxidizing high-k gate dielectric layer 105 at a relatively low temperature for a relatively short time period, the high-k gate dielectric layer may retain its amorphous state, and the amount of oxygen that diffuses to the silicon interface may be reduced. This, in turn, may limit the amount of additional oxide that is grown at that interface-ensuring that the thickness of buffer layer 110 will remain substantially unchanged.

As an alternative to using a plasma assisted oxidation process or a thermal oxidation process, a chemical oxidation, steam oxidation, ozone clean, or peroxide clean process may be, used to reoxidize high-k gate dielectric layer 105. Various combinations of these processes, e.g., certain wet/dry oxidation steps, may also be employed. The process used to oxidize high-k gate dielectric layer 105 is not limited to those listed above. The method of the present invention contemplates using any suitable oxidizing step that takes place in any suitable oxidizing ambient, or any acceptable chemical treatment that causes the ratio of oxygen to metal in high-k gate dielectric layer 105 to increase.

After oxidizing high-k gate dielectric layer 105, a gate electrode may be formed on it. In a preferred embodiment, the gate electrode may be formed by initially depositing polysilicon layer 120 on high-k gate dielectric layer 105—generating the FIG. 1c structure. Polysilicon layer 120 may be deposited using conventional methods and preferably is between about 500 angstroms and about 4,000 angstroms thick. After etching layers 120, 105 and 110 to form the FIG. 1d structure, using conventional techniques, additional steps that are generally used to complete the gate electrode (e.g., forming a silicide (not shown) on the upper part of etched polysilicon structure 130) may be applied. As such steps are well known to those skilled in the art, they will not be described in more detail here. Although the gate electrode preferably comprises polysilicon, it may alternatively be formed from various metals that may be used with the above described high-k gate dielectrics.

In another embodiment of the present invention, the high-k gate dielectric layer is formed directly on the substrate, and the buffer layer is subsequently formed between the substrate and the high-k gate dielectric layer—separating the substrate from the high-k gate dielectric layer. FIGS. 2a–2d illustrate this alternative embodiment. Unlike the embodiment described above, high-k gate dielectric layer 205 is deposited directly on substrate 200, generating the FIG. 2a structure. High-k gate dielectric layer 205 may comprise any of the materials mentioned above and may be deposited on substrate 200 using any of the techniques described previously. As in the above described process, dielectric layer 205 preferably is less than about 20 angstroms thick, and more preferably is between about 5 angstroms and about 20 angstroms thick.

In this alternative embodiment, high-k gate dielectric layer 205 is then reoxidized, e.g., using any of the processes identified previously, to significantly increase the ratio of oxygen to metal at the surface of the dielectric layer. This oxidation step may cause oxidizing species to rapidly diffuse through ultra-thin dielectric layer 205. These oxidizing species may cause buffer layer 210 to grow on substrate 200 to create the FIG. 2b structure. In this alternative embodiment, the reoxidation process should be carried out under the appropriate conditions for a sufficient time to cause a controlled buffer layer, e.g., one comprising a silicon oxide, to grow on substrate 200. In a preferred embodiment, buffer layer 210 comprises a silicon dioxide layer that is less than about 15 angstroms thick, and more preferably that is between about 5 angstroms and about 15 angstroms thick.

Figure 2A:
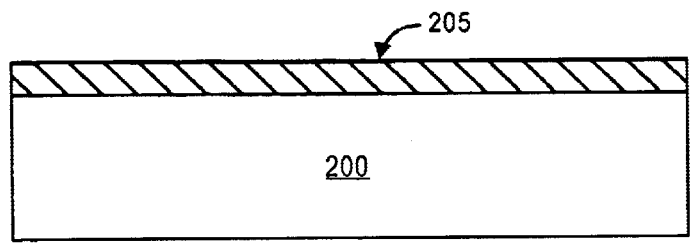
FIGS. 2a–2d represent cross-sections of structures that may be formed when carrying out an alternative embodiment of the method of the present invention.
Figure 2B:
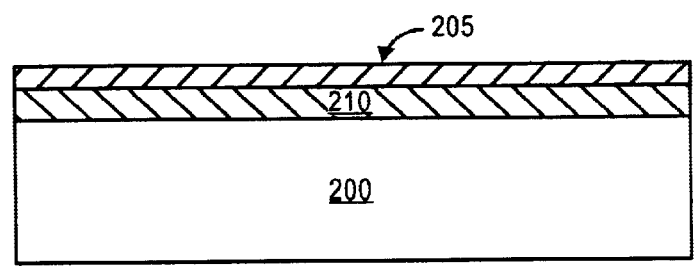
Figure 2C:
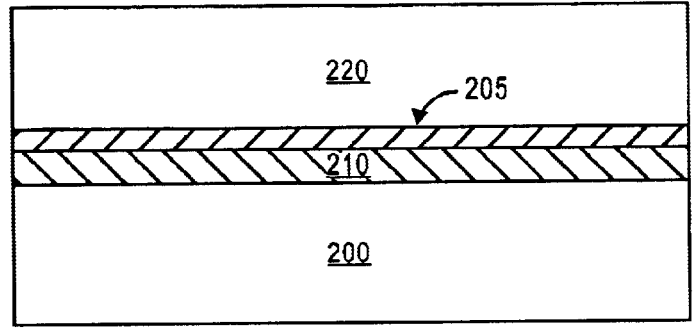
Figure 2D:
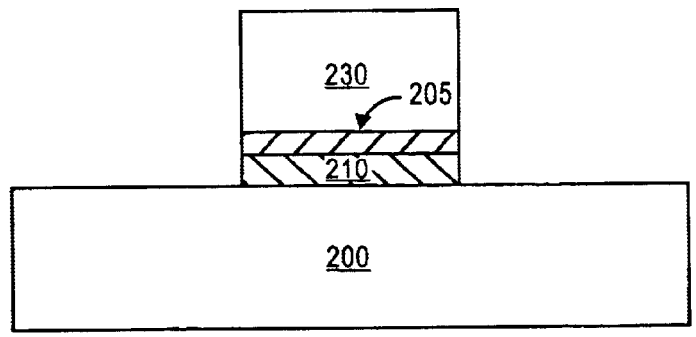

After oxidizing high-k gate dielectric layer 205, and growing buffer layer 210, a gate electrode may be formed on dielectric layer 205. As in the previously described embodiment, polysilicon layer 220 may be deposited on high-k gate dielectric layer 205 to generate the FIG. 2c structure. Conventional process steps may follow to complete the gate electrode (including etching layers 220, 205 and 210 to form a device that includes etched structure 230, as shown in FIG. 2d), as will be apparent to those skilled in the art.

The process described above may produce a device with an ultra-thin high-k gate dielectric that is not shorted through the gate dielectric. Such a dielectric may have less oxygen vacancies and less impurities (e.g., chlorine ions derived from the precursor chemistry). As a result, the dielectric should exhibit superior film properties, which may give it interface properties that render the dielectric suitable for use with polysilicon and other gate electrode materials.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for making a semiconductor device comprising:
   forming on a substrate a buffer layer and a high-k gate dielectric layer;
   oxidizing the surface of the high-k gate dielectric layer by exposing that surface to ionized oxygen species; and then
   forming a gate electrode on the oxidized high-k gate dielectric layer.

2. The method of claim 1 wherein the buffer layer is formed on the substrate prior to forming the high-k gate dielectric layer on the buffer layer.

3. The method of claim 1 wherein the high-k gate dielectric layer is formed on the substrate, and the buffer layer is then formed between the high-k gate dielectric layer and the substrate when the surface of the high-k gate dielectric layer is oxidized.

4. The method of claim 1 wherein the high-k gate dielectric layer is less than about 20 angstroms thick, is formed using an atomic layer chemical vapor deposition process, and comprises a material selected from the group consisting of hafnium oxide, lanthanum oxide, zirconium oxide, zirconium silicon oxide, titanium oxide, tantalum oxide, yttrium oxide, and aluminum oxide.

5. The method of claim 1 wherein the ionized oxygen species are generated using a plasma assisted oxidation process.

6. The method of claim 1 wherein the oxidation takes place at a temperature that is less than about 500° C.

7. The method of claim 1 wherein the gate electrode comprises polysilicon.

8. The method of claim 1 wherein the buffer layer comprises a material select d from the group consisting of silicon oxide and silicon oxynitride.

9. The method of claim 1 wherein the buffer layer is less than about 15 angstroms thick.

10. The method of claim 2 wherein the buffer layer is grown on the substrate and wherein the buffer layer comprises silicon dioxide.

11. A method for making a semiconductor device comprising:
    forming on a substrate a buffer layer that comprises a material selected from the group consisting of silicon oxide and silicon oxynitride;
    forming on the buffer layer a high-k gate dielectric layer that comprises a material selected from the group consisting of hafnium oxide, zirconium oxide, titanium oxide, and aluminum oxide;
    oxidizing the surface of the high-k gate dielectric layer using a plasma assisted oxidation process carried out at a temperature that is less then about 500° C.; and then
    forming a layer that comprises polysilicon on the oxidized high-k gate dielectric layer.

12. The method of claim 11 wherein the high-k gate dielectric layer is formed by atomic layer chemical vapor deposition, and is between about 5 angstroms and about 20 angstroms thick.

13. The method of claim 11 wherein the buffer layer is less than about 15 angstroms thick, is grown on the substrate, and comprises silicon dioxide.

* * * * *